United States Patent
Chen et al.

(10) Patent No.: US 11,177,432 B2
(45) Date of Patent: Nov. 16, 2021

(54) HEUSLER-ALLOY AND FERRIMAGNET BASED MAGNETIC DOMAIN-WALL DEVICES FOR ARTIFICIAL NEURAL NETWORK APPLICATIONS

(71) Applicant: INTERNATIONAL BUSINESS MACHINES CORPORATION, Armonk, NY (US)

(72) Inventors: Ching-Tzu Chen, Ossining, NY (US); See-Hun Yang, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 93 days.

(21) Appl. No.: 16/002,543

(22) Filed: Jun. 7, 2018

(65) Prior Publication Data
US 2019/0378973 A1 Dec. 12, 2019

(51) Int. Cl.
| | | |
|---|---|---|
| *H01L 43/08* | (2006.01) | |
| *H01L 27/22* | (2006.01) | |
| *G11C 11/16* | (2006.01) | |
| *G11C 11/54* | (2006.01) | |
| *H01L 43/12* | (2006.01) | |

(Continued)

(52) U.S. Cl.
CPC .......... *H01L 43/08* (2013.01); *G06N 3/0635* (2013.01); *G11C 11/161* (2013.01); *G11C 11/54* (2013.01); *H01F 10/3254* (2013.01); *H01F 10/3272* (2013.01); *H01F 10/3286* (2013.01);
(Continued)

(58) Field of Classification Search
CPC ......... H01L 43/08; H01L 43/06; H01L 43/10; H01L 27/226; H01L 43/12; H01L 27/22; H01L 43/02–12; H01L 27/222–228; H01F 10/3286; H01F 1/00–447; H01F 10/00–3295; H01F 10/3272–3277; H01F 41/307; H01F 10/1936; H01F 10/3254; G11C 11/161; G11C 11/54; G11C 2211/5615–5616; G11C 11/5607; G11C 14/0036; G11C 14/0081; G11C 19/02–10; G06N 3/0635; C11C 19/14
See application file for complete search history.

(56) References Cited

U.S. PATENT DOCUMENTS

| | | | |
|---|---|---|---|
| 9,070,455 B2 | 6/2015 | Grollier et al. | |
| 9,489,618 B2 | 11/2016 | Roy et al. | |

(Continued)

OTHER PUBLICATIONS

Indiveri, G. et al., "Integration of nanoscale memristor synapses in neuromorphic computing architectures" Nanotechnology (Sep. 2013) pp. 1-13, vol. 24.

(Continued)

*Primary Examiner* — Nelson Garces
(74) *Attorney, Agent, or Firm* — Tutunjian & Bitetto, P.C.; Randall Bluestone

(57) ABSTRACT

A synapse device includes a perpendicularly magnetized ferrimagnetic racetrack layer, a tunneling barrier layer disposed on the racetrack layer and a reference layer including a perpendicular magnetic alloy. The racetrack layer, the tunneling layer and the reference layer have a channel portion and contact pad portions. First and second contacts are provided over the contact pad portions, and a third contact is provided over the channel portion, wherein the first and second contacts are electrically isolated from the third contact.

12 Claims, 10 Drawing Sheets

(51) Int. Cl.
*H01L 43/10* (2006.01)
*H01F 10/32* (2006.01)
*G06N 3/063* (2006.01)

(52) U.S. Cl.
CPC ............ *H01L 27/226* (2013.01); *H01L 43/10* (2013.01); *H01L 43/12* (2013.01)

(56) References Cited

U.S. PATENT DOCUMENTS

| | | |
|---|---|---|
| 2011/0147816 A1* | 6/2011 | Nikonov .............. G01R 33/093 257/295 |
| 2012/0163069 A1 | 6/2012 | Grollier et al. |
| 2013/0314978 A1* | 11/2013 | Currivan .............. G11C 11/161 365/158 |
| 2014/0028347 A1 | 1/2014 | Robinett et al. |
| 2015/0317558 A1 | 11/2015 | Adachi et al. |
| 2019/0189516 A1* | 6/2019 | Sasaki .................... H01L 29/82 |
| 2019/0333558 A1* | 10/2019 | Shibata .............. G11C 11/1675 |

OTHER PUBLICATIONS

Koyama, T. et al., "Observation of the intrinsic pinning of a magnetic domain wall in a ferromagnetic nanowire" Nature Materials (Mar. 2011) pp. 194-197, vol. 10.

Fumarola, A. et al., "Accelerating Machine Learning with Non-Volatile Memory: exploring device and circuit tradeoffs" IEEE International Conference on Rebooting Computing (ICRC) (Oct. 2016) pp. 1-8.

Gokmen, T. et al., "Acceleration of Deep Neural Network Training with Resistive Cross-Point Devices: Design Considerations" Frontiers in Neuroscience (Jul. 2016) pp. 1-13, vol. 10.

Sharad, M. et al., "Spin-Based Neuron Model With Domain-Wall Magnets as Synapse" IEEE Transactions on Nanotechnology (Jul. 2012) pp. 843-853, vol. 11, No. 4.

Sengupta, A. et al., "Spintronic Devices for Ultra-low Power Neuromorphic Computation" IEEE International Symposium on Circuits and Systems (ISCAS) (May 2016) pp. 922-925.

Fong, X. et al., "Spin-Transfer Torque Devices for Logic and Memory: Prospects and Perspectives" IEEE Transactions on Computer-Aided Design of Integrated Circuits and Systems (Jan. 2016) pp. 1-22, vol. 35, No. 1.

Panda, P. et al., "INVITED—Cross-Layer Approximations for Neuromorphic Computing: From Devices to Circuits and Systems" Design Automation Conference (DAC), 2016 53nd ACM/EDAC/IEEE (Jun. 2016) pp. 1-6.

Curtarolo, S. et al., "The high-throughput highway to computational materials design" Nature Materials (Mar. 2013) pp. 191-201, vol. 12.

Jo, S.H. et al., "Nanoscale Memristor Device as Synapse in Neuromorphic Systems" Nano Letters (Mar. 2010) pp. 1297-1301, vol. 10.

Sengupta, A. et al., "Prospects of Efficient Neural Computing with Arrays of Magneto-metallic Neurons and Synapses" 2016 21st Asia and South Pacific Design Automation Conference (ASP-DAC) (Jan. 2016) pp. 115-120.

Yang, S-H et al., "Domain-wall velocities of up to 750 m s-1 driven by exchange-coupling torque in synthetic antiferromagnets" Nature Nanotechnology (Feb. 2015) pp. 1-6.

\* cited by examiner

HEUSLER-ALLOY AND FERRIMAGNET BASED MAGNETIC DOMAIN-WALL DEVICES FOR ARTIFICIAL NEURAL NETWORK APPLICATIONS

BACKGROUND

Technical Field

The present invention generally relates to synapse devices and methods for fabrication, and more particularly to synapse devices having a magnetic racetrack layer that is easily and rapidly programmed to update its state.

Description of the Related Art

Deep neural networks (dNN) can provide superior functioning to other machine learning algorithms in many cognitive workloads, including pattern recognition, speech recognition and natural language processing. However, training dNN requires a substantial amount of computing resources and time to train a large array of weight factors for artificial synapses.

SUMMARY

In accordance with an embodiment of the present invention, a synapse device includes a perpendicularly magnetized ferrimagnet racetrack layer, a tunneling barrier layer disposed on the racetrack layer and a reference layer including a perpendicular magnetic alloy. The racetrack layer, the tunneling layer and the reference layer have a channel portion and contact pad portions. First and second contacts are provided over the contact pad portions. A third contact is provided over the channel portion, wherein the first and second contacts are electrically isolated from the third contact.

A neural network device includes a conductive grid having first conductive lines, second conductive lines and third conductive lines wherein the first conductive lines are disposed transversely to the second conductive lines and third conductive lines and crosspoint synapse devices coupled to the first, second and third conductive lines at conductive line intersection points. The crosspoint synapse devices each include a perpendicularly magnetized ferrimagnet racetrack layer; a tunneling barrier layer disposed on the racetrack layer; and a reference layer including a perpendicular magnetic alloy. The racetrack layer, the tunneling layer and the reference layer of each crosspoint synapse device has a channel portion contact coupled to a third conductive line and contact pad contacts coupled to a respective first and second conductive lines, wherein the contact pad contacts are electrically isolated from the channel portion contact.

A method for forming a synapse device includes blanket depositing a stack of layers, on a substrate, including a perpendicularly magnetized ferrimagnet racetrack layer, a tunneling barrier layer on the racetrack layer and a reference layer including a perpendicular magnetic alloy; defining a mesa structure from the stack of layers having a channel portion and contact portions on opposing ends, by a patterning process, wherein the contact pad portions include a width at least three times a width of the channel portion; forming a sidewall spacer around the mesa structure; depositing a conductive material to form first, second and third contacts where the first and second contacts are formed over the contact pad portions and the third contact is formed over the channel portion; and patterning the conductive material and the reference layer such that the reference layer of the contact pad portions is isolated from the reference layer of the channel portion.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
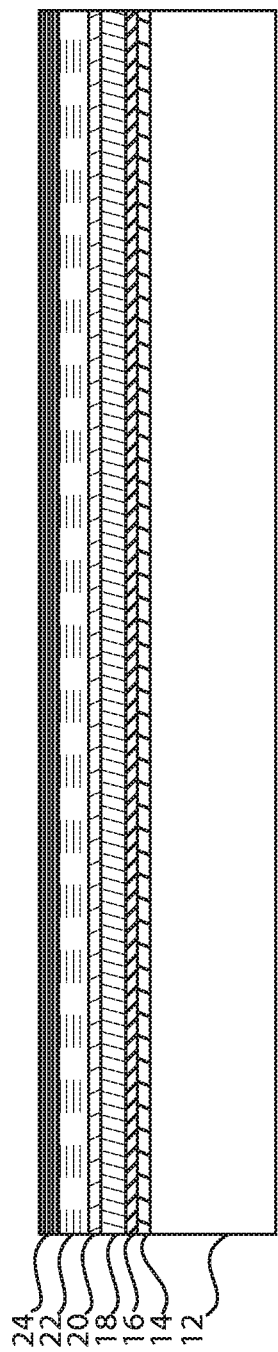
FIG. 1 is a cross-sectional view showing a substrate having a stack of layers blanket deposited thereon for the formation of a domain wall synapse device in accordance with an embodiment of the present invention.

In accordance with aspects of the present invention, devices, systems and fabrication methods are described for producing and employing local devices for neural network arrays and other useful applications. In useful embodiments, synaptic weight updates can be locally implemented using crosspoint arrays of resistive memory elements to boost a learning speed of a neural network by orders of magnitude through minimizing data shuttling between computer processing units (CPUs) and memory and maximizing parallel processing. Hardware realization of such a resistive processing units can include a multi-level design having preferably hundreds to thousands of intermediate states. The synapse devices can be bi-directional having symmetric update operations. The device can include threshold behavior in these update operations and a sufficient resistance variation (e.g., greater than 2 times) with sufficient speed (e.g., less than 100 ns per update).

In particularly useful embodiments, a three-terminal magnetic domain-wall synaptic device is employed as a crosspoint device in a neural network. While the devices can be employed in other structures or capacities, the neural network applications can take advantage of many of the benefits of the three-terminal device. The three-terminal synaptic device adopts a synthesized Heusler alloy that can address the hardware realization requirements described above. The three-terminal Heusler synaptic device fully resolves an operation hysteresis problem that plagues other complementary metal oxide semiconductor (CMOS) compatible synaptic devices. That is, prevailing synaptic devices, e.g., ReRAM elements and phase-change materials (PCM) fail to produce symmetric operations in weight updates and require additional circuitry at the periphery of the synapse array to compensate for the device non-ideality, which results in a large array footprint.

In comparison, the three-terminal magnetic domain-wall synapse devices in accordance with the present embodiments provide intrinsically bi-directional, symmetric domain-wall motion under current bias, provide a current threshold in domain-wall motion, provide a narrow domain-wall width (e.g., less than or equal to about 1 nm) when employing strong perpendicular magnetic anisotropy materials (PMA), which permit many intermediate states in a relatively small structure, and provide a greater than 100% change in tunneling magnetoresistance (TMR) for readout operations.

Furthermore, the three-terminal Heusler synaptic device significantly alleviates an impedance mismatch problem that plagues other magnetic synaptic device when embedded in a CMOS circuitry. The three-terminal magnetic domain-wall synapse devices in accordance with the present embodiments overcome the relatively small channel resistance issues (e.g., sheet resistance is much less than ~100 Ohms), which reduces significant voltage drops and parasitic lead resistance accumulated across a large synaptic array. High threshold current density (which conventionally can be on the order of $10^7$ to $10^8$ A/cm$^2$) is also significantly reduced which also reduces high power consumption for a large array.

Aspects of the present invention include the use of perpendicular ferrimagnetic alloys for programming and training of neural network arrays. In one embodiment, the perpendicular ferrimagnetic alloys include Heusler alloys. Heusler alloys can include $Mn_3Z$ materials where Z can include Sn, Ge, Sb, Al, Bi, As and Se, similar materials or combinations of these materials. The Heusler alloys in accordance with embodiments of the present invention can be employed in magnetic domain-wall synaptic devices to address issues for accelerating deep neural network (dNN) training. The synaptic devices substantially enhance device channel resistance relative to the parasitic lead resistance (e.g., reduced be about 100 times over conventional solutions), increase a number of intermediate states for weight update because of a much narrower domain-wall width (e.g., reduced by around 5 times), achieve symmetric weight updates and threshold behavior without additional circuitry, reduce operating current density by at least a factor of 5 times compared to conventional solutions, and enable reliable current-driven domain-wall motion at low current density through domain-wall precession.

The magnetic domain-wall synaptic devices in accordance with embodiments of the present invention can also include other ferrimagnet materials, e.g., using CoTb, CoGd, FeTb, FeGd or similar materials. The magnetic domain-wall synaptic devices reduce the operating current density by at least a factor of 5 times compared to conventional magnetic devices by reducing the ferrimagnet saturation magnetization by materials engineering (e.g., alloy ratio and multilayer thicknesses).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, device structures and fabrication methods are described for a three-terminal magnetic domain-wall synaptic device, which can be employed as crosspoint devices in a neural network or for other applications. A device 10 includes a substrate 12. The substrate 12 can include any suitable substrate material. In particularly useful embodiments, substrate 12 can include a MgO (001) single crystal material, monocrystalline Si, monocrystalline Si with a single crystal MgO (001) material, Si or any other suitable materials can be employed.

The following layers can be blanket deposited over the substrate 12. A seed layer 16 can be formed on the substrate 12 and can include an epitaxially grown chemical templating layer CoGa compound thin film or a CoAl compound thin film or CoIn compound thin film, etc. The seed layer 16 can be grown on a MgO (001) single crystal substrate 12 with a buffer layer 14 on which the seed layer 16 is formed. The buffer layer 14 can include MgO, Cr, or Cr/MgO bilayer(s). The buffer layer 14 can be formed epitaxially if a crystal structure is needed or by sputtering, although other deposition processes can be employed. The seed layer 16 can be epitaxially grown using physical vapor deposition (PVD), atomic layer deposition, molecular beam epitaxy or other epitaxially growth process.

A thin racetrack layer or channel layer 18 of perpendicularly magnetized ferrimagnetic materials is then deposited on top of the seed layer 16, preferably at room temperature (RT) to form an active domain-wall channel layer. The racetrack layer 18 includes can include perpendicularly magnetized ferrimagnetic materials, e.g., Heusler alloy materials with high resistivity for magnetic neuromorphic synaptic devices. Heusler alloys can include, e.g., $Mn_3Ge$, $Mn_3Sn$, $Mn_3Sb$, etc. Ferrimagnetic materials include populations of atoms with opposing magnetic directions, as in antiferromagnetism; however, in ferrimagnetic materials, the opposing magnitudes are unequal and a spontaneous magnetization remains.

The seed layer 16, buffer layer 14 and the racetrack layer 18 can have a combined thickness of between about 2 nm to about 10 nm, with the racetrack layer 18, e.g., 20%-90% of the thickness. A deposition of a tunnel barrier layer 20 on the racetrack layer 18 is performed. The tunnel barrier layer 20 can be deposited using a physical vapor deposition (sputtering), evaporation or other suitable deposition process. The tunnel barrier layer 20 can include e.g., MgO, although other materials can be employed. In one embodiment, the tunnel barrier layer 20 can include a thickness of about 1-3 nm.

A ferromagnet (FM) layer or reference layer 22 with perpendicular magnetic anisotropy (PMA) is formed on the tunnel barrier layer 20. The FM layer 22 can include, e.g., a CoFeB thin film, a Co/Ni film stack, a Co/Pt film stack, synthetic antiferromagnets such as, e.g., a [Co/Pt multilayer stack]/Ru/[Co/Pt multilayer stack], etc. The Co/Ni and Co/Pt films stacks can include multiple alternating layers of these materials. The FM layer 22 can be deposited using a sputtering, evaporation or other suitable deposition process. A contact metal layer 24 can be formed on the FM layer 22. The contact metal layer 24 can include Ta, Ru, TaN or other metals or conductive compounds or materials. The contact metal layer 24 can include any suitable non-magnetic (NM) material. In one embodiment, the contact metal layer 24 and the FM layer 22 can include a combined thickness of between about 10-100 nm. In one useful embodiment, a resulting stack includes a MgO (001) substrate/buffer (MgO/Cr or MgO)/CoGa or CoAl or CoIn seed layer/Heusler alloy ($Mn_3Sn$, $Mn_3Ge$, or $Mn_3Sb$ or others)/tunnel barrier (e.g. MgO)/PMA FM layer/contact metal.

In another embodiment, substrate 12 can include Si, Si with $SiO_x$, or other suitable nonmagnetic substrate materials with a buffer layer 14 of, e.g., MgO (001), grown and annealed thereon. The seed layer 16 can be grown on the MgO (001) buffer layer 14. The buffer layer 14 can include MgO, or Cr, or Cr/MgO. The buffer layer 14 can be formed by sputtering, although other deposition processes can be employed.

The thin racetrack layer 18 of perpendicularly magnetized Heusler alloy is then deposited on top of the seed layer 16, followed by the tunnel barrier layer 20, FM layer 22 with PMA and the contact metal layer 24. In another useful embodiment, a resulting stack includes a Si substrate/MgO (001) buffer/(MgO/Cr or MgO)/CoGa or CoAl seed layer/ Heusler alloy ($Mn_3Sn$, $Mn_3Ge$ or $Mn_3Sb$ or Mn based binary Heusler alloys)/tunnel barrier (e.g., MgO)/PMA FM layer/ contact metal.

In another embodiment, the active domain-wall channel material (racetrack 18) includes another ferrimagnet material for ferrimagnetic layer 18, e.g., CoTb, CoGd, FeTb, FeGd or alloys or combinations thereof. The ferrimagnetic alloys can be grown directly on Si substrates (12) with other buffer layers such as, e.g., Ru, Ta, TaN, or non-spin Hall metal layer or with a spin-Hall metal layer (e.g., Pt) as the buffer layer 14 or seed layer 16. The tunnel barrier 20 is formed on the ferrimagnet or ferrimagnetic layer 18. The resulting stack can include, e.g., Si/(with or without) spin-Hall metal/ferrimagnet (CoTb, CoGd, FeTb, or FeGd)/ tunnel barrier/PMA FM layer/contact metal.

In another embodiment, the active domain-wall channel material can include a ferrimagnetic multilayer 18, e.g., [Co/Tb]n, [Co/Gd]n, [Fe/Tb]n, or [Fe/Gd]n, where n is a number of pair layers of the material pair in brackets. The ferrimagnetic alloys can be grown directly on Si substrates (12) with or without a spin-Hall metal layer (e.g., Pt) as the buffer layer 14 or seed layer 16. The resulting stack can include Si/buffer layer (with or without) a spin-Hall metal/ ferrimagnetic multilayer ([Co/Tb]n, [Co/Gd]n, [Fe/Tb]n, or [Fe/Gd]n)/tunnel barrier/PMA FM layer/contact metal.

Figure 2:
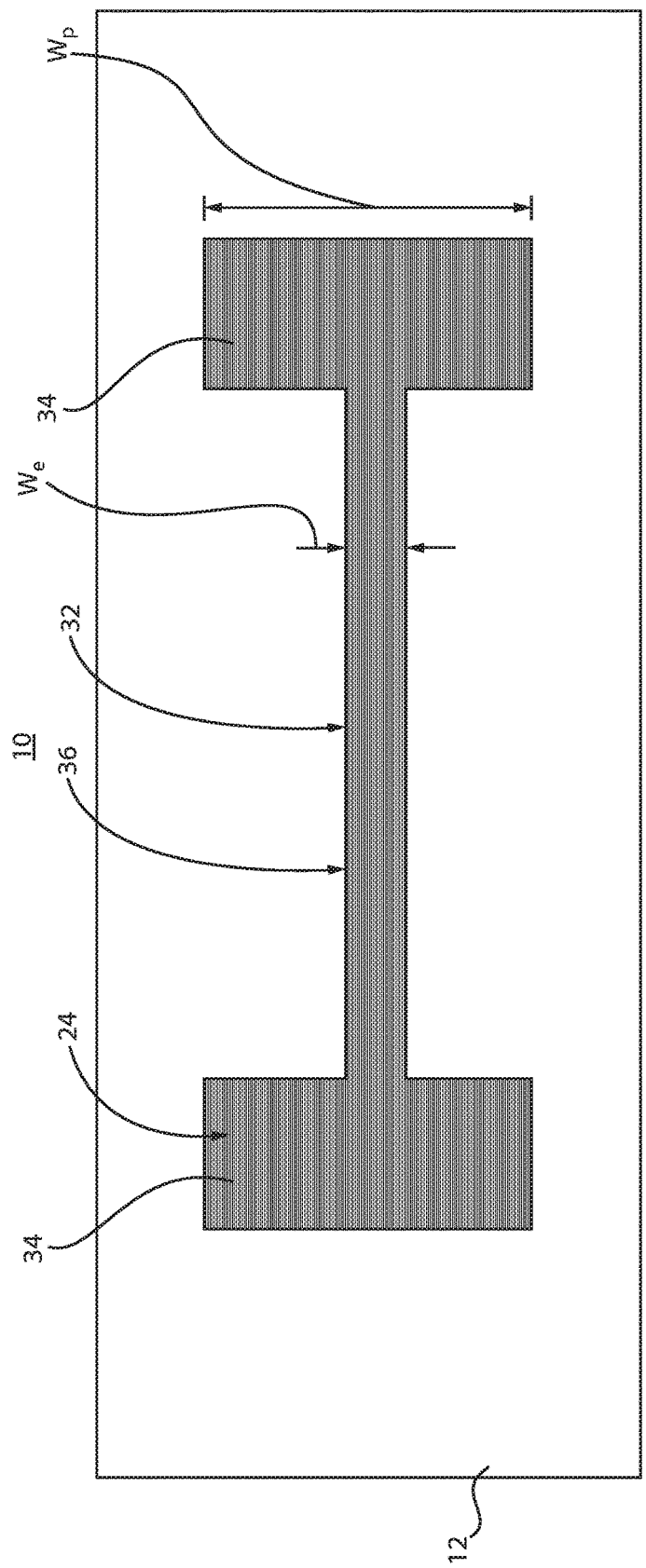
FIG. 2 is a top view of the stack of layers of FIG. 1 after being patterned to form a mesa structure in the form of an "H" in accordance with an embodiment of the present invention.
Figure 3:
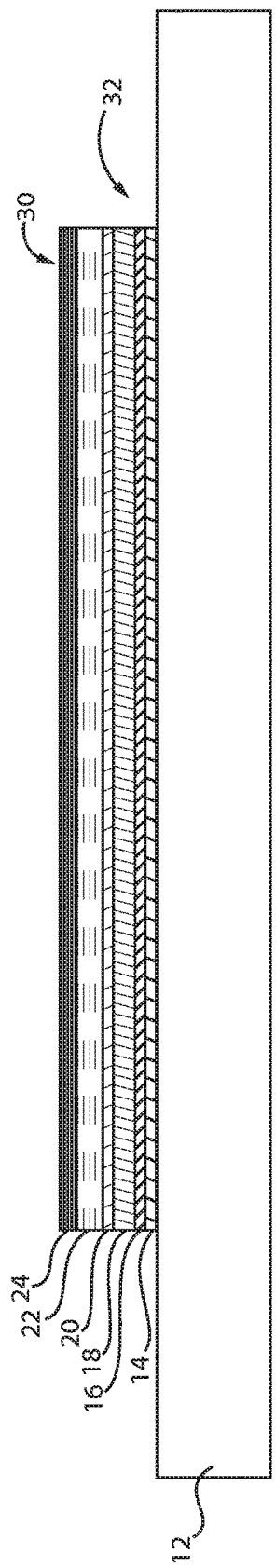
FIG. 3 is a cross-sectional view of the mesa structure of FIG. 3 in accordance with an embodiment of the present invention.

Referring to FIGS. 2 and 3, an etch definition process, such as, e.g., an ion beam etch (IBE), wet etch, or reactive ion etch (RIE), is performed to pattern and etch a shape of the synapse device in accordance with the present embodiments. FIG. 2 shows a top view of the device 10 having an "H" shape. FIG. 3 shows a side cross-sectional view including a stack 30 of layers using one of the stacks of layers described with respect to FIG. 1. Other stack configurations are also contemplated. The stack 30 can be formed into a mesa structure 32 by forming a resist mask (not shown) on the contact layer 24. An etch process such as an IBE is performed to remove unmasked materials down to the substrate to form the mesa structure 32.

The mesa structure 32 can be defined by etching, keeping widths ($W_p$) of contact pads 34 at least 3 times a width ($W_c$) of channel 36 (channel width) to stop domain wall motion at the end of the track (e.g., where the pads 34 and the channel 36 meet) in the channel region 36. In addition, the contact pad portion area for each pad 34 is preferably at least ten times the channel portion area 36.

Figure 4:
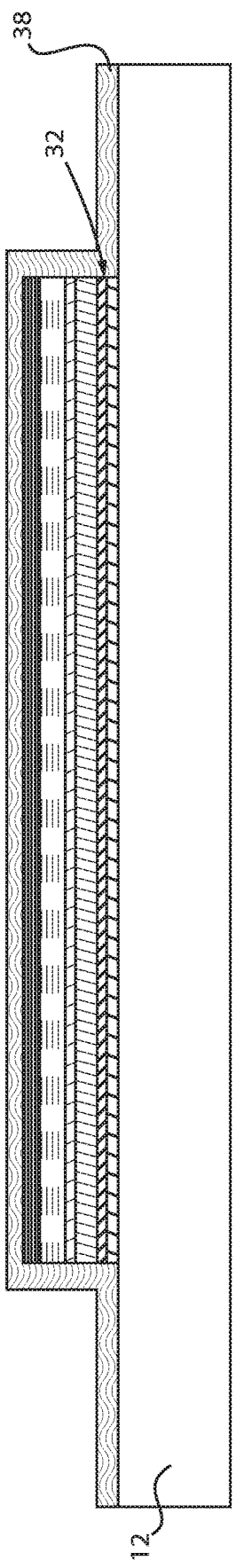
FIG. 4 is a cross-sectional view showing a sidewall spacer layer deposition over the mesa structure of FIG. 3 in accordance with an embodiment of the present invention.

Referring to FIG. 4, a dielectric layer 38 can be formed over the contact metal 24. The dielectric layer 38 can be blanket deposited or conformally deposited by, e.g., a physical vapor deposition (PVD) process, a chemical vapor deposition (CVD) process or a plasma enhanced CVD (PECVD) process. The dielectric layer or cap 38 can include silicon oxide, silicon nitride or other dielectric materials.

Figure 5:
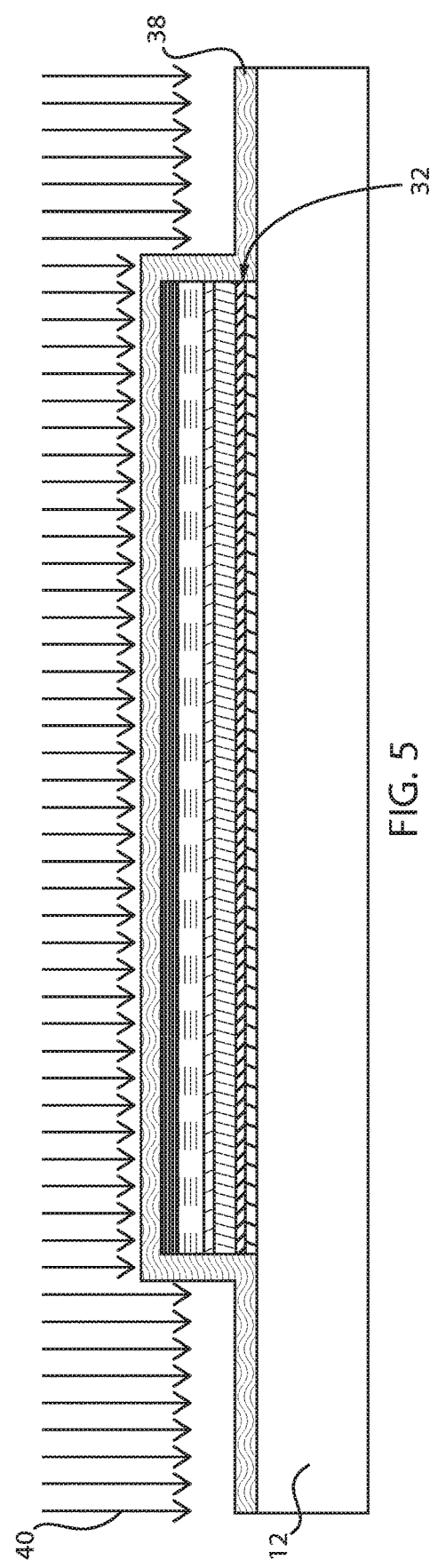
FIG. 5 is a cross-sectional view showing sidewall spacer formation by etching over the mesa structure of FIG. 4 in accordance with an embodiment of the present invention.

Referring to FIG. 5, the dielectric layer 38 is etched using ions 40 in, e.g., an IBE process, to remove horizontal portions of the dielectric layer 38 and leave vertical portions remaining to provide side-wall protection of the mesa structure 32 and encapsulate an exposed channel region. The deposition and etch process can be performed prior to removing the resist mask employed in etching the mesa structure 32.

Figure 6:
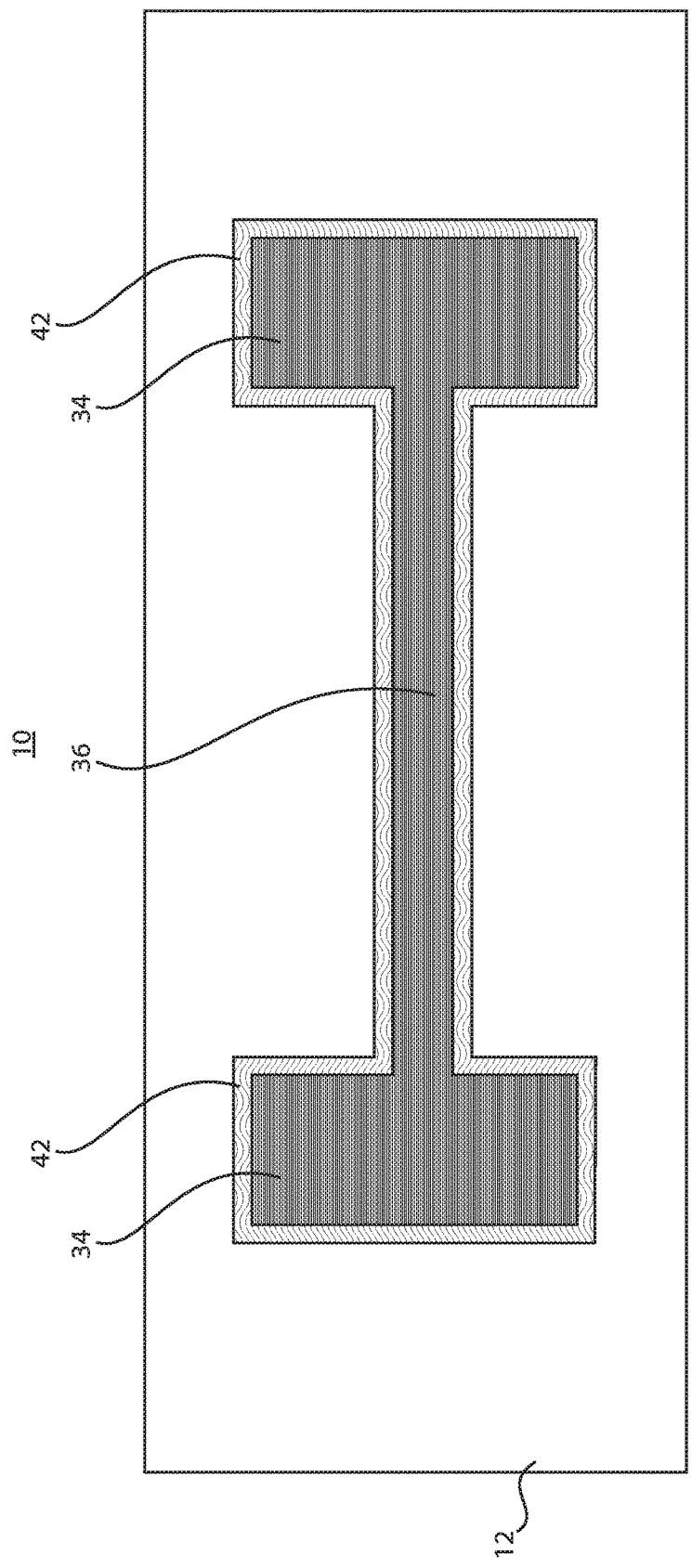
FIG. 6 is a top view showing the completed sidewall spacer in accordance with an embodiment of the present invention.
Figure 7:
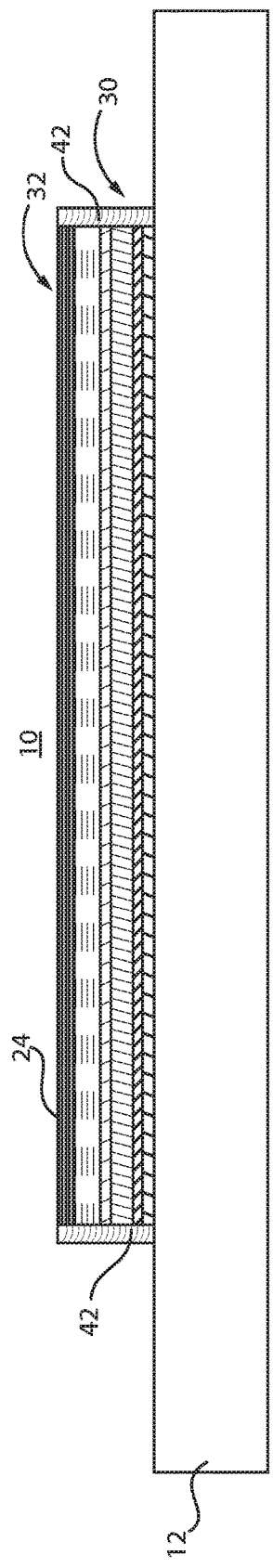
FIG. 7 is a cross-sectional view showing the completed sidewall spacer on sidewalls of the mesa structure of FIG. 6 in accordance with an embodiment of the present invention.

Referring to FIGS. 6 and 7, a sidewall spacer 42 surrounds an outline of the synapse device 10 in accordance with the present embodiments. FIG. 6 shows a top view of the device 10 having the "H" shape outlined in the spacer 42. FIG. 7 shows a side cross-sectional view including the stack 30 of layers with sidewall spacers 42 formed on vertical surfaces of the mesa structure 32.

Figure 8:
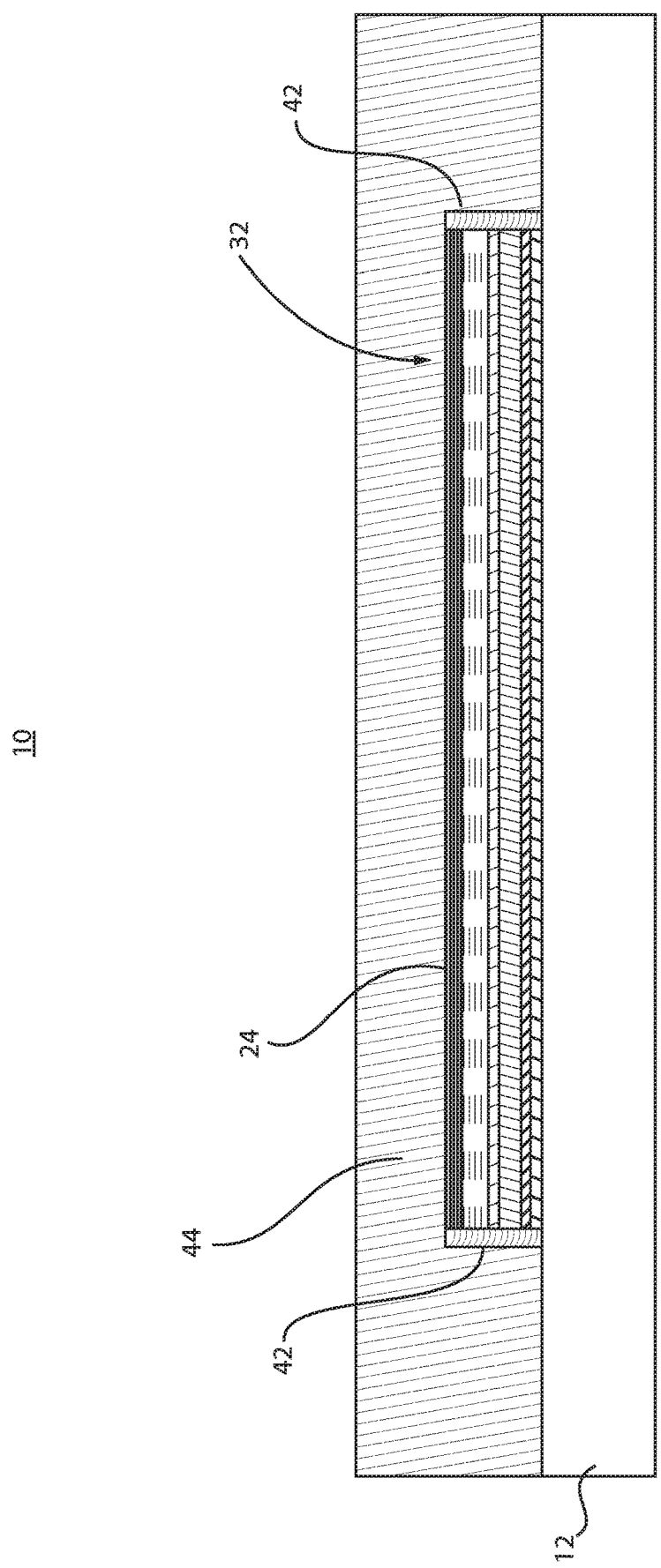
FIG. 8 is a cross-sectional view showing a deposition of a contact material over the mesa structure of FIG. 7 in accordance with an embodiment of the present invention.

Referring to FIG. 8, a conductive cap layer 44 is formed over the mesa structure 32 and exposed portions of the substrate 12. The cap layer 44 can be deposited using a CVD process, although other suitable deposition processes may be employed. The cap layer 44 can include a tantalum nitride or other suitable contact material.

Figure 9:
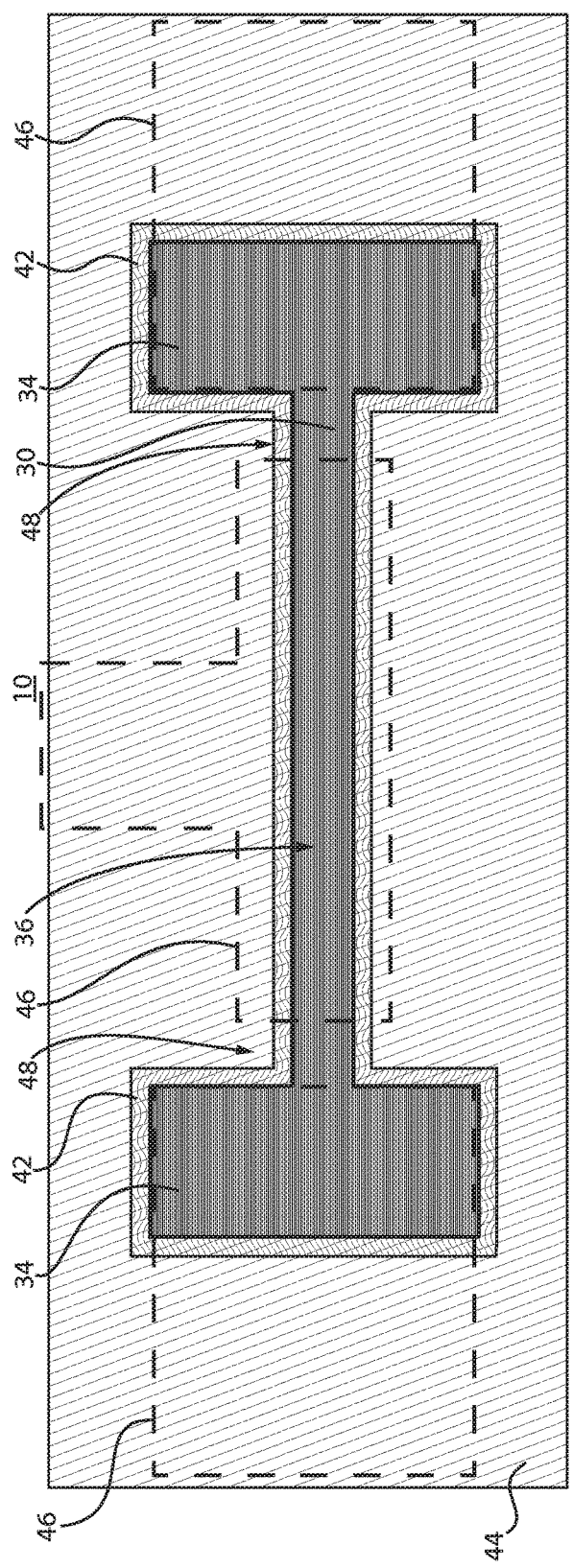
FIG. 9 is a top view showing the contact material patterned using a resist to form distinct contacts to contact pads and channel region of a synapse device of FIG. 8 in accordance with an embodiment of the present invention.
Figure 10:
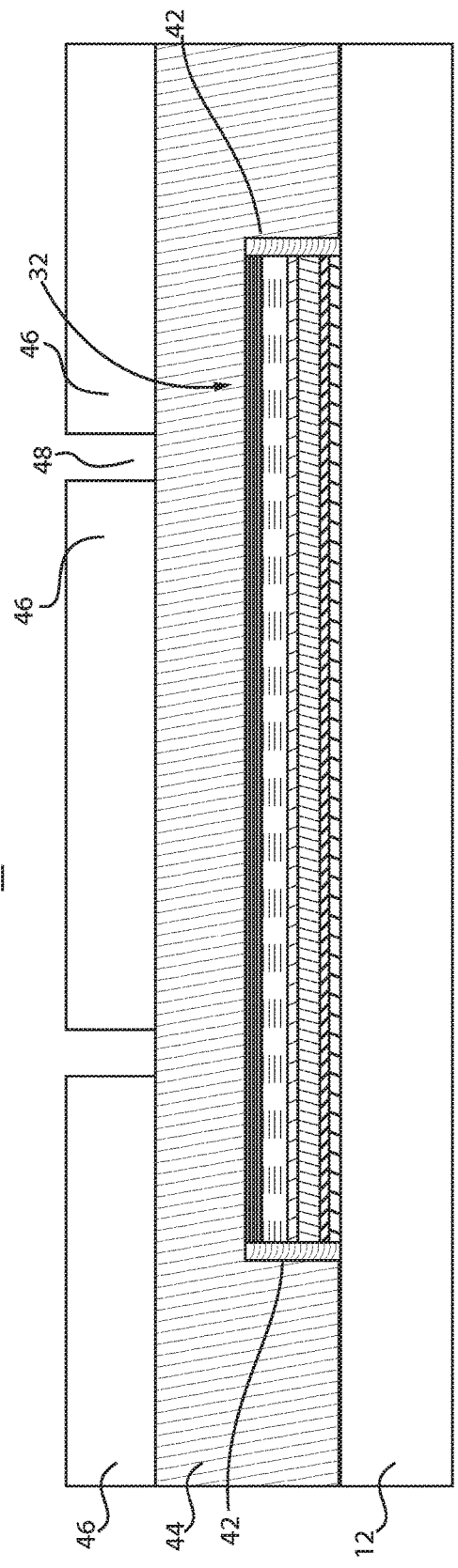
FIG. 10 is a cross-sectional view showing the synapse device of FIG. 9 with openings in the resist at interface locations between the channel region and the contact pads in accordance with an embodiment of the present invention.

Referring to FIGS. 9 and 10, a resist layer 46 is formed on the cap layer 44 and patterned to open up openings 48. FIG. 9 shows a top view of the device 10 having the "H" shape covered by the cap layer 44 with the resist layer patterned in dotted regions 46 with openings 48 formed to expose the mesa structure 32 at an interface between contact pads 34 and the channel region 36. The resist layer 46 is depicted with dotted lines so that underlying features are visible. In addition, the cap layer 44 is depicted in phantom over the spacers 42 and invisible over the "H" structure so that contacts 34 and channel 36 are visible. FIG. 10 shows a side cross-sectional view including the stack 30 of layers with openings 48 located over interface portions between the channel portion 36 and the contact pads 34.

The resist layer 46 can be spun onto the device 10 by a spin-on resist process or the like and exposed for polymerization followed by a development process to form the pattern shown including openings 48. Any suitable lithographical patterning process can be employed.

Figure 11:
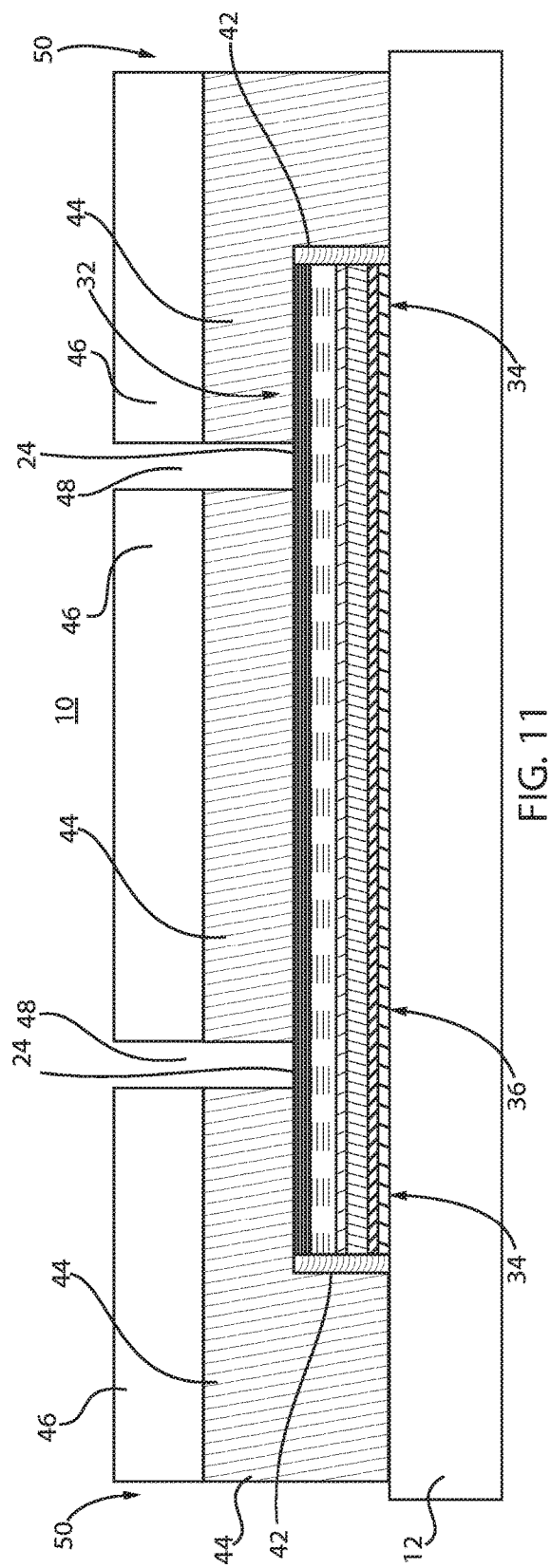
FIG. 11 is a cross-sectional view showing the openings in the resist of FIG. 10 etched down through contact material at the interface locations in accordance with an embodiment of the present invention.

Referring to FIG. 11, the resist layer 46 is employed as an etch mask to etch through the cap layer 44 down to the mesa structure 32 stopping on the contact layer 24 in openings 48 and stopping of the substrate 12 in other areas, e.g., areas 50. The cap layer 44 is etched using, e.g., RIE. The openings 48 align with the mesa structure 32 at the interfaces of the channel 36 and the contact pads 34.

Figure 12:
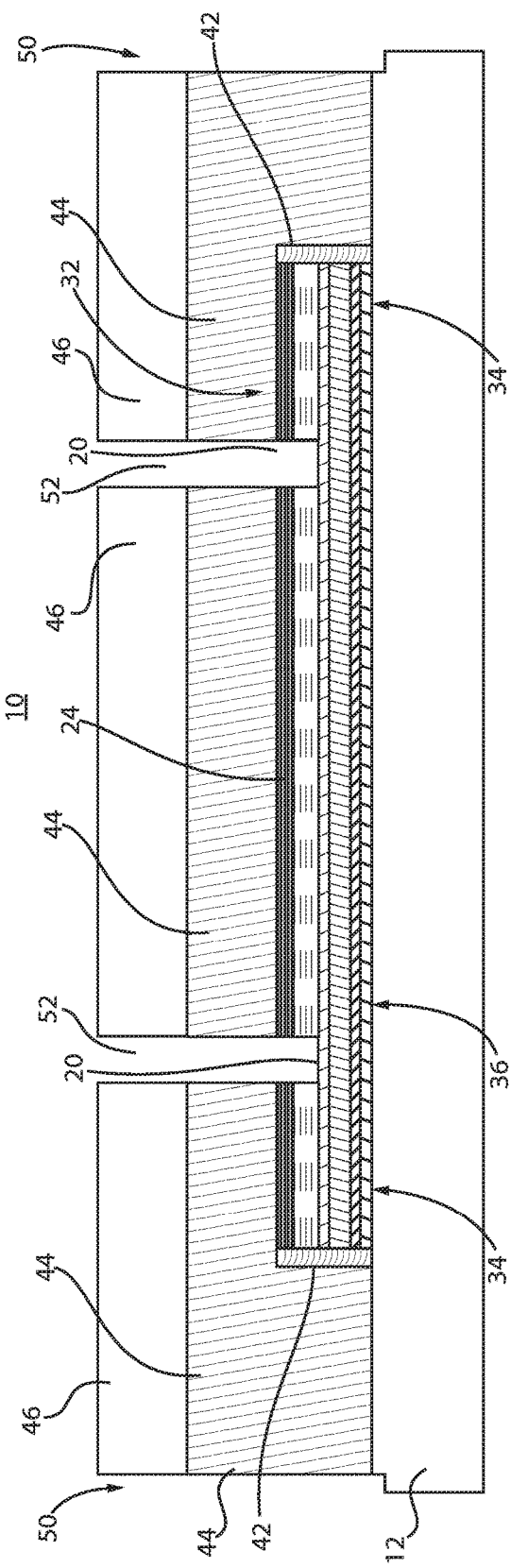
FIG. 12 is a cross-sectional view showing the openings in the contact material of FIG. 11 etched down through a reference layer to expose a tunneling barrier layer at the interface locations in accordance with an embodiment of the present invention.

Referring to FIG. 12, a second etching can be adopted to etch (e.g., IBE) through the contact layer 24 and FM layer 22 stopping on the tunnel barrier layer 20. The etch employs the cap layer 44 as an etch mask with openings 52 formed using openings 48 in the resist layer 46. The etching away of conductive reference layer materials serves to isolate domain-wall racetrack contacts of contacts pads 34 from a tunneling junction contact in the channel or channel region 36. This further defines contacts to the contact pads 34 and gate over the channel region 36.

Figure 13:
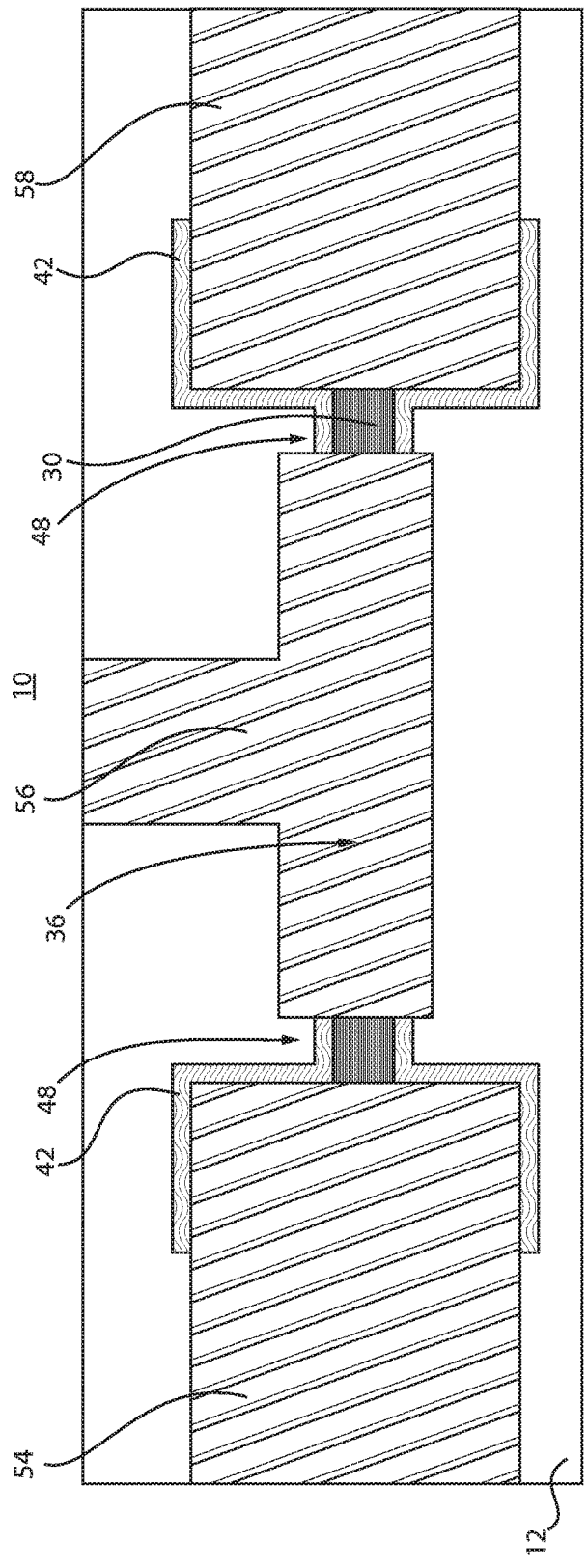
FIG. 13 is a top view showing completed contacts after the etch of FIG. 12 in accordance with an embodiment of the present invention.
Figure 14:
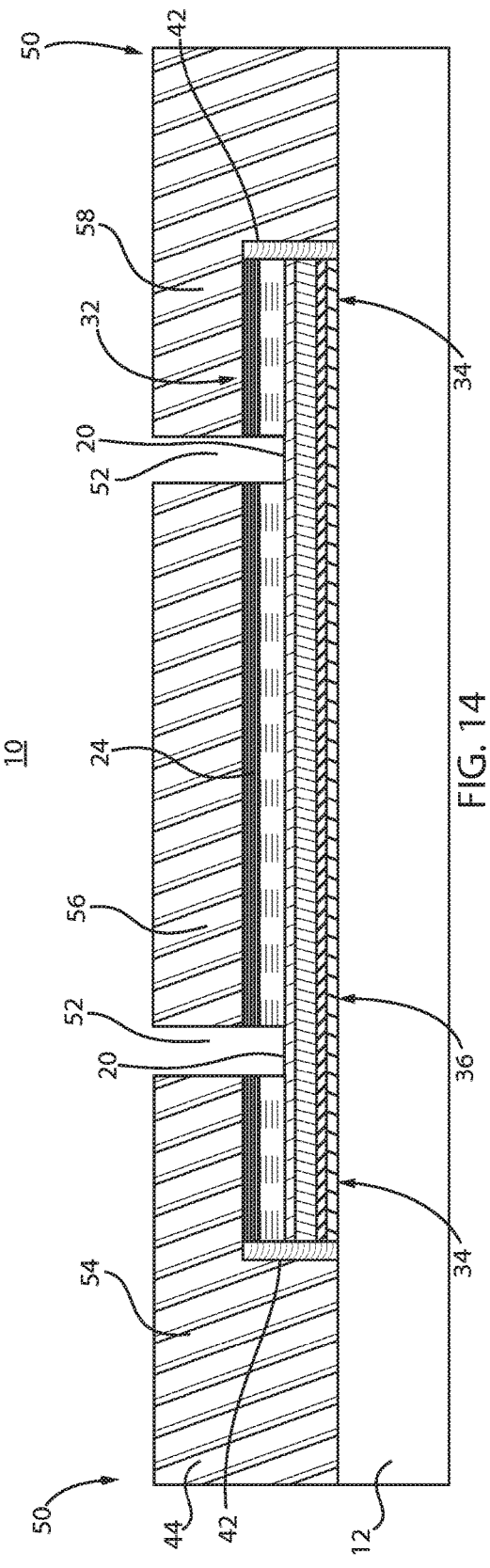
FIG. 14 is a cross-sectional view showing the completed contacts of FIG. 13 in accordance with an embodiment of the present invention.

Referring to FIGS. 13 and 14, a completed synapse device 10 is illustratively depicted in accordance with one embodiments. FIG. 13 shows a top view of the device 10, and FIG. 14 shows a cross-sectional view of the device 10. Contacts 54, 56 and 58 are formed by patterning the cap layer 44. An additional contact metal layer (not shown) may be deposited on top of contacts 54, 56, and 58, e.g., using Cu, W, Ti or any other suitable non-magnetic metal. The contacts 54, 56 and 58 provide three terminals for connecting to a crosspoint grid. The crosspoint grid can be employed for accessing the device to program data and to store states for coefficients or weights in a neural network application.

The synapse device 10 provides a resistive processing unit with multi-level states, e.g., hundreds to thousands of intermediate states. This is achieved by creating a domain wall between portions of the thin racetrack layer 18 (FIG. 1) of perpendicularly magnetized material, e.g., ferrimagnetic materials, and in particular, a Heusler alloy (e.g., $Mn_3Ge$, $Mn_3Sn$, $Mn_3Sb$, etc.), which is adjacent to the tunneling barrier layer 20. The FM contact layer 22 provides a reference layer having a fixed magnetization direction. The domain wall separates portions of opposite magnetization directions in the racetrack layer 18. A portion of the racetrack layer 18 will have the same magnetization direction as the reference layer 22 while a portion will have an opposite magnetization direction to that of the reference layer 22.

The junction areal ratio between the parallel and antiparallel regions will determine the conductance across the tunneling layer 20 and therefore represent a weighting or state of the device. The domain wall can be repositioned along the racetrack layer 18 through current-pulse programming via two of the three terminals of the device 10 (e.g., via contacts 54 and 58) by current-induced domain-wall motion. So any position along the channel region 36 in the racetrack layer 18 can host the domain wall separating regions of opposite magnetic domains. Once programmed, the location of the domain wall can be employed to represent different states since resistance to current flow across the tunnel junction 20 (between contact pads 54 and 56 or contact pads 58 and 56) is affected. The magnetic domain walls naturally show symmetric displacement under opposite current polarities, and the narrow domain-wall width (~nm) allows a high granularity of its position (e.g., many states). Furthermore, domain-wall motion has a sharp current threshold behavior so states can be easily programmed using digital encoding.

The three-terminal magnetic domain-wall devices 10 provide bi-directional, symmetric domain-wall motion under current bias, and provide a current threshold in domain-wall motion. The domain-wall width is narrow (e.g., less than about 1 nm) with perpendicular magnetic anisotropy (PMA) materials, which permits for many intermediate states in a relatively small structure. Tunneling magnetoresistance (TMR) is employed for readout. For example, a weight can be inversely proportional to the tunneling magnetoresistance of the device. Furthermore, domain-wall motion under ~ns to ~ms current pulses is achievable. Despite many appealing characteristics, magnetic domain-wall devices can suffer from at least two drawbacks: (1) relatively small channel resistance (sheet resistance ~100 Ohm), which results in a significant voltage drop across the parasitic lead resistance accumulated across a large synaptic array; and (2) high operating current density (on the order of $10^7$-$10^8$ $A/cm^2$), which demands high power consumption for a large array. The present embodiments do not suffer from these drawbacks.

The synaptic devices 10 reduce the parasitic lead resistance relative to the device channel resistance (e.g., ≥100 times) and increase the number of intermediate states for weight update because of a much narrower domain-wall width. Symmetric weight updates and threshold behavior are achieved without additional circuitry. Low operating current density and reliable current-driven domain-wall motion at low current density through domain-wall precession are also achieved.

Figure 15:
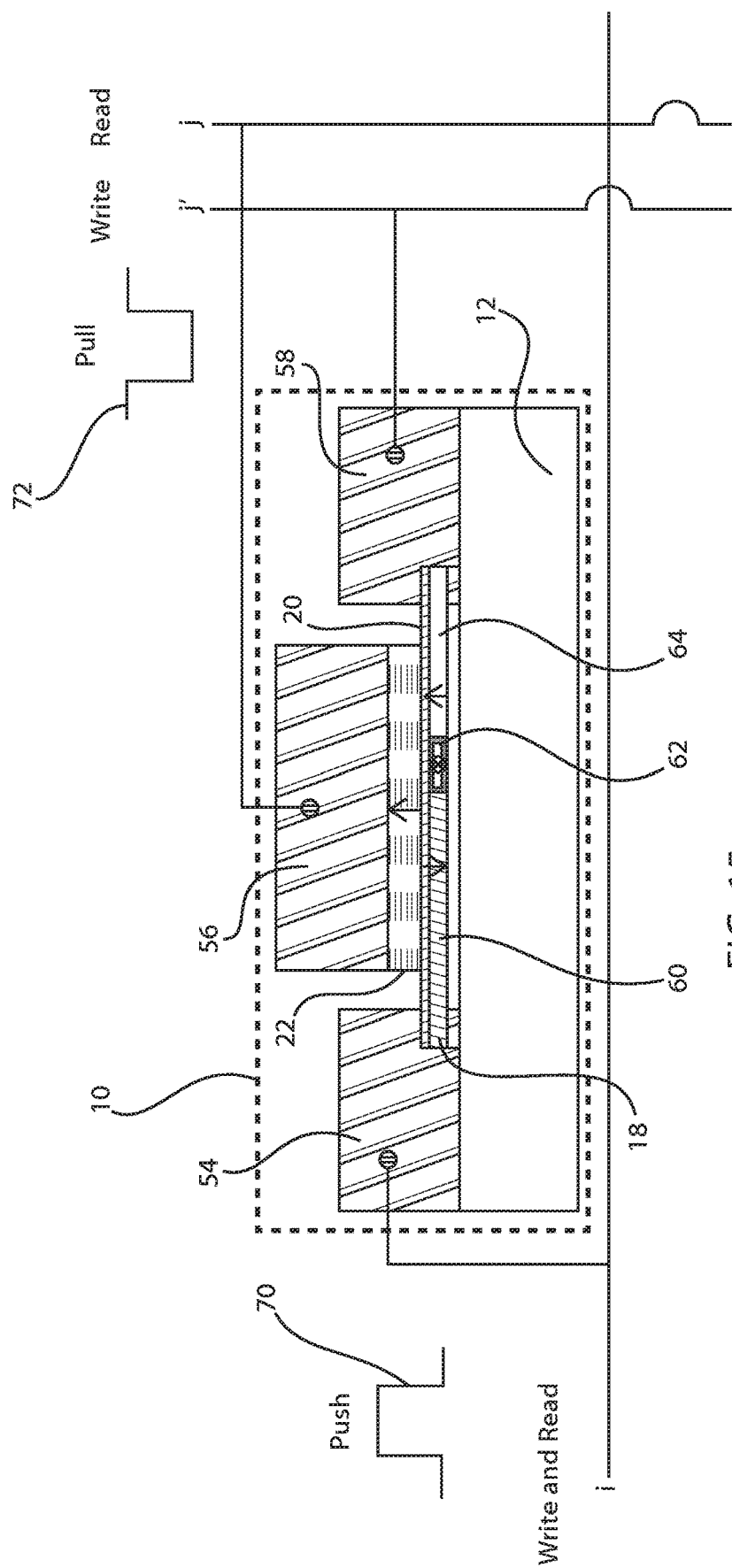
FIG. 15 is a schematic diagram showing a synapse device having a domain wall and three terminals configured to update properties of the racetrack layer to represent coefficients or weights in a neural network application in accordance with an embodiment of the present invention.

Referring to FIG. 15, a schematic diagram shows a possible implementation of the synapse device 10 in accordance with the present embodiments. The device 10 includes a connection i to the contact 54 and connections j and j', respectively to contacts 56 and 58. A domain wall 62 is an interface separating magnetic domains 60 and 64. The domain wall 62 is a transition between different magnetization directions (indicated by arrows in layer 18) from 0° to 180° or from 180° to 0° for up-down or down-up domain configurations respectively. The domain wall 62 is a continuous reorientation of individual magnetization directions across a finite distance. The domain wall width depends on the anisotropy of the material but can span less than 1 nm in magnetic materials with strong anisotropy, such as a Heusler alloy. The width of the domain wall varies due to the two opposing energies (magnetization directions) that create the wall, e.g., magnetocrystalline anisotropy energy and exchange energy. The anisotropy energy is lowest when the individual magnetization directions are aligned with the crystal lattice axes thus reducing the width of the domain wall. The exchange energy is reduced when the neighboring magnetization directions are aligned parallel to each other and thus increases the domain wall thickness. An equilibrium is reached between the two and the domain wall's width is set.

The domain wall 62 between portions 60 and 64 of the thin racetrack layer 18 of perpendicularly magnetized ferrimagnetic materials is adjacent to the tunneling barrier layer 20. The FM contact layer 22 provides a reference having a fixed magnetization direction layer (with an arrow showing magnetization direction for this example). The domain wall 62 separates portions of opposite magnetization directions 60, 64 in the racetrack layer 18. A portion of the racetrack layer 18 will have the same magnetization direction as the reference layer 22 while a portion will have an opposite magnetization direction to that of the reference layer 22.

Domain walls are highly stable and their generation and motion can be controlled using electric current. The equation that can describe the domain wall profile corresponds to the sine-Gordon equation:

$$\theta = 2\tan^{-1}\exp\left(\pm\frac{x}{\Delta}\right),$$

where $\theta$ is the direction of magnetic moments, x is the position in the x direction along a surface and $$\Delta = \sqrt{\frac{A}{K}},$$

where K is the exchange energy density and A is the anisotropy energy. The sine-Gordon equation denotes soliton propagation whose nonlinearity cancels the dispersion to preserve the waveform. Consequently, domain wall profiles can be sustained over macroscopic distances during domain wall motion.

By encoding data in the domain wall position 62, information can be electrically processed and retained for a sufficiently long time for compute and memory applications. This is especially desirable for applications using non-conventional, analog computing algorithms and architecture, e.g., machine learning for artificial intelligence (AI) applications, including imaging classifications, speech recognition, and language translation to name a few.

Figure 16:
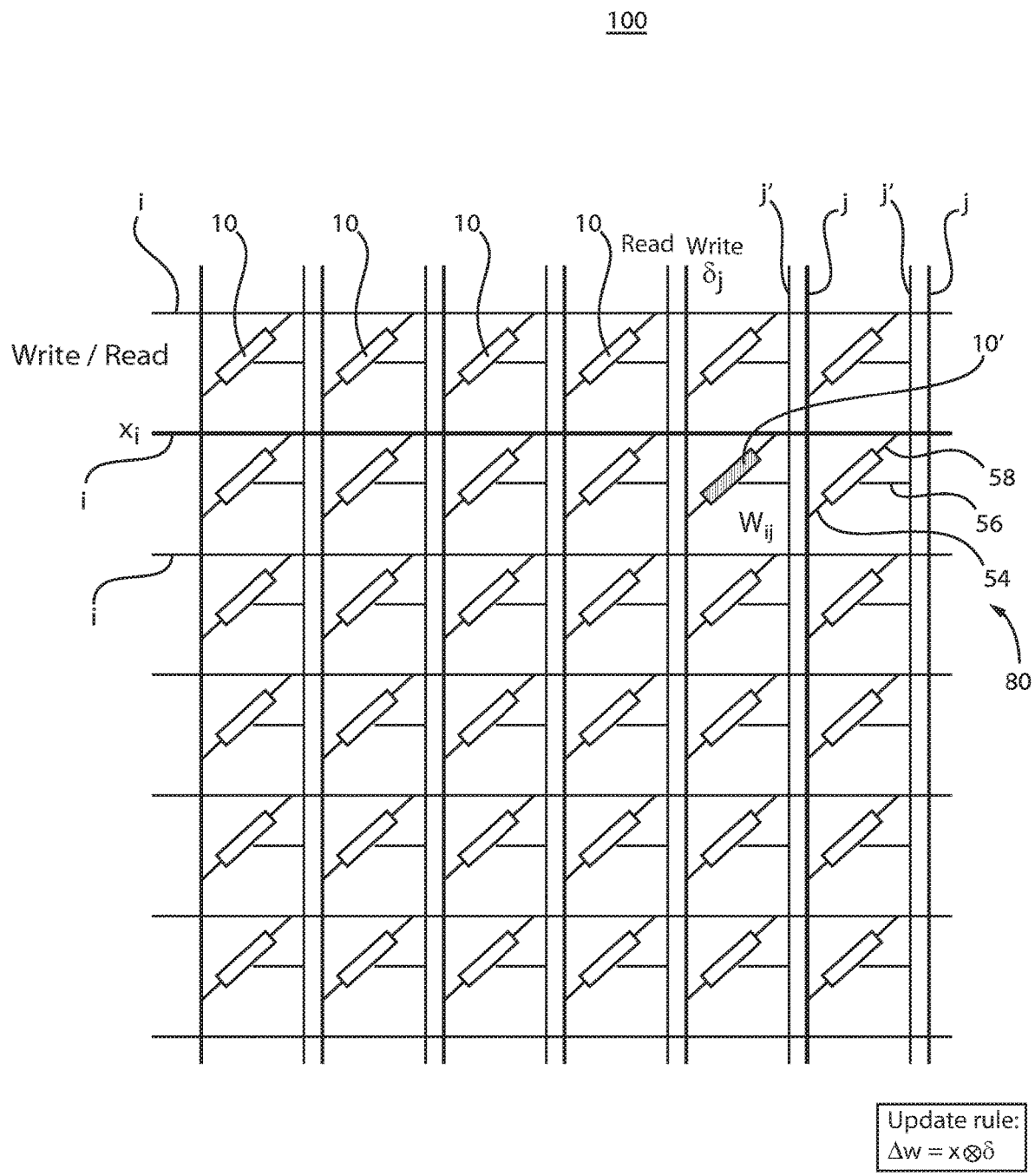
FIG. 16 is a schematic diagram showing an array or grid of an a neural network device having three terminal synapse devices for resistive memory elements that employ tunneling magnetoresistance for weighting paths through the network in accordance with an embodiment of the present invention.

Referring to FIG. 16, with continued reference to FIG. 15, a resistive processing unit (RPU) (e.g., neural network 100) can implement training through on-chip matrix multiplication using simple physics laws (e.g., Ohms law) during forward propagation, the input voltages (to the variable resistor array 80 encode the input signals ($x_i$), and the conductance values $G_{ij}$ encode the synaptic weight ($w_{ij}$). By Ohm's law and Kirchoff's law, the total current ($I_j$) at each column directly yields the signal after matrix multiplication ($y_i$). Similarly, during backward propagation, the error signals ($\delta_j$) are encoded as the column voltages ($V_j$). The total current at each row ($I_i$) then directly yields the error corrections propagated to the previous network layer. During weight updating, the input and error signals are both encoded as voltages or currents applied to the columns and rows of the array: $V_i \propto x_i$, $V_j \propto \delta_j$. The device conductance then changes according to $\Delta G_{ij} \propto V_i \cdot V_j$ to implement the update rule. All inputs are processed concurrently to maximize parallel processing.

An exemplary implementation of weight updating is to encode the magnitude of the input ($x_i$) and the error signal ($\delta_j$) in the on/off probability of the stochastic bit streams $V_{xi}$ and $V_{\delta j}$, respectively. This permits a transformation of the multiplication operation ($x_i \cdot \delta_j$) to a simple AND operation at the cross point. Only when $V_{xi}$ and $V_{\delta j}$ pulses coincide would conductance change by a unit step ($\Delta w_{min}$) to update the synaptic weight. In other words, when a push signal 70 (FIG. 15) in a row line (i) occurs at a same time as a pull signal 72 (FIG. 15) in a column line (j), the synaptic weight will be updated (in an AND operation).

The cross bar or crosspoint grid or array 80 is shown for a neural network 100 in accordance with an illustrative embodiment. The grid 80 includes j and j' column lines and i rows lines transversely disposed to one another. The j lines include an end terminal j line which connects to a contact pad (e.g., 58 in FIG. 15) and a j' connection that is coupled to a central contact (e.g., 56 in FIG. 15). The i connection contacts another end contact pad (e.g., 54 in FIG. 15).

The 3-terminal magnetic domain-wall synapse device 10 is placed at each cross point of the neural network 100 grid 80 and includes a magnetic domain-wall channel (racetrack) 18, a tunnel barrier 20, and a reference magnetic layer 22 as shown in FIG. 15. Both the domain-wall channel 18 and the reference layer 22 are perpendicularly magnetized. The synaptic weight ($w_{ij}$) is encoded in the domain-wall position and read out by the tunneling resistance (or equivalently, conductance).

During forward (backward) propagation, the input (or error) signals are encoded as the applied voltages across the tunnel junction 20 between contact 56 and contacts 54, 58. The tunneling current is summed over all devices 10 in the same column (or row), which yields feedforward signals (or back-propagated errors). During weight updates, the input (x) and error ($\delta$) signals are encoded as the applied current pulses to contacts 54 and 58, respectively, which would move the domain wall 62 and vary the synaptic weights ($w_{ij}$). The weight, $w_{ij}$ is proportional to the tunneling conductance. The tunneling conductance and the domain wall location of channel layer are altered in accordance with a magnitude of the current through racetrack channel of the device 10.

When electrons are tunneling between two magnetic metals, the magnitude of the tunneling current depends on the relative orientation of the magnetization of both electrodes. The tunneling current is proportional to the product of the electrode density of states (DOS) at the Fermi level and, in ferrimagnetic materials, the ground-state energy bands in the vicinity of the Fermi level, which are shifted in energy, yielding separate majority and minority bands for electrons with opposite spins. Assuming spin conservation for the tunneling electrons, there are two parallel currents of spin-up and spin-down character.

For parallel aligned magnetization, electrons around the Fermi level with spin up and spin down, are permitted to tunnel from majority to majority bands, and from minority to minority bands. When the magnetization is antiparallel, tunneling takes place from majority to minority and minority to majority bands. In the latter case, this leads to a reduction of total tunneling current across the junction layer 20 (for example, small tunneling current results from opposite (antiparallel) magnetization between layers 18 and 22, while large current results from parallel magnetization between layers 18 and 22). For electrical conductance, this corresponds to a lower tunneling conductance across the insulating tunnel layer 20 when the magnetization of the two layers is oppositely aligned.

The synaptic device effectively works as two magnetic tunnel junctions connected in parallel—one junction with parallel magnetization directions between the racetrack and reference layers 18 and 22, the other junction with anti-parallel magnetization directions between layers. The total conductance (across the central contact 56 to the edge contact 54 or 58) is the sum of the tunneling conductance through the two individual junctions separated by the domain wall 62. The magnitude of the total conductance is thus determined by the domain wall position.

The domain-wall position can be programmed by passing current pulses through the racetrack channel via the edge contacts 54 and 58. The current-induced domain-wall displacement is controlled by the magnitude and the pulse length of the current pulses. By varying the current-pulse magnitude, pulse length and frequency, the weight ($w_{ij}$, which is proportional to tunneling conductance) can therefore be programmed. For example, the weight, $w_{ij}$, can become $w_{jk} \pm \Delta w$, where $\Delta w = x \otimes \delta$ and $\otimes$ is the tensor or cross product of between x and $\delta$. The $\Delta w$ can include a step or unit value so that thresholds need to be met before a state changes or weight can be changed, which naturally leverages the current threshold of the current-induced domain-wall motion.

Having described preferred embodiments of devices, systems and methods of Heusler-alloy and ferrimagnet based magnetic domain-wall devices for artificial neural network applications (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A synapse device, comprising:
a perpendicularly magnetized ferrimagnet racetrack layer including a domain wall separating the racetrack layer into two regions with opposite directions of magnetization;
a tunneling barrier layer disposed on the racetrack layer;
a reference layer including a perpendicular magnetic alloy;
the racetrack layer, the tunneling layer and the reference layer having a channel portion;
first and second contacts directly contacting a top surface of a substrate and directly contacting a top surface of the tunneling barrier layer; and
a third contact directly contacting a top surface of the reference layer, wherein the first and second contacts are electrically isolated from the third contact and wherein the first contact extends over only a first region of the racetrack layer having a first perpendicular direction of magnetization and the second contact extends over only the second region of the racetrack layer having a second perpendicular direction of magnetization, the second perpendicular direction of magnetization being opposite the first perpendicular direction of magnetization, and wherein the third contact directly contacting the top surface of the reference layer extends over both the first and second regions of the racetrack layer,
wherein the domain wall moves along a horizontal plane extending through sidewalls of the first and second contacts.

2. The device as recited in claim 1, wherein the ferrimagnet racetrack layer includes a Heusler alloy of a $Mn_3Z$ material where Z is selected from the group consisting of Sn, Ge, Sb, Al, Bi, As, and Se.

3. The device as recited in claim 1, wherein the ferrimagnet racetrack layer includes an alloy selected from the group consisting of CoTb, CoGd, FeTb, FeGd and combinations thereof.

4. The device as recited in claim 1, wherein the ferrimagnet racetrack layer includes a multilayer ferrimagnet structure having one or more layers of material pairs selected from the group consisting of Co/Tb, Co/Gd, Fe/Tb and Fe/Gd.

5. The device as recited in claim 1, further comprising a weight that is inversely proportional to a tunneling magnetoresistance of the device.

6. The device as recited in claim 1, wherein the first, second and third contacts are configured to control domain wall motion and magnetization direction of the racetrack layer to provide a plurality of states for the device.

7. A neural network device, comprising:
a conductive grid having first conductive lines, second conductive lines and third conductive lines wherein the first conductive lines are disposed transversely to the second conductive lines and third conductive lines; and
crosspoint synapse devices coupled to the first, second and third conductive lines at conductive line intersection points, the crosspoint synapse devices, each including:
a perpendicularly magnetized ferrimagnet racetrack layer including a domain wall separating the racetrack layer into regions with opposite directions of magnetization;
a tunneling barrier layer disposed on the racetrack layer;
a reference layer including a perpendicular magnetic alloy; and
first and second contacts directly contacting a top surface of a substrate and directly contacting a top surface of the tunneling barrier layer;
the racetrack layer, the tunneling layer and the reference layer of each crosspoint synapse device having a channel portion contact coupled to a third conductive line and wherein the first contact extends over only a first region of the racetrack layer having a first perpendicular direction of magnetization and the second contact extends over only the second region of the racetrack layer having a second perpendicular direction of magnetization, the second perpendicular direction of magnetization being opposite the first perpendicular direction of magnetization, and wherein a third contact directly contacting a top surface of the reference layer extends over both the first and second regions of the racetrack layer,
wherein the domain wall moves along a horizontal plane extending through sidewalls of the first and second contacts.

8. The device as recited in claim 7, wherein the ferrimagnet racetrack layer includes a Heusler alloy of a $Mn_3Z$ material where Z is selected from the group consisting of Sn, Ge, Sb, Al, Bi, As, and Se.

9. The device as recited in claim 7, wherein the ferrimagnet racetrack layer includes an alloy selected from the group consisting of CoTb, CoGd, FeTb, FeGd and combinations thereof.

10. The device as recited in claim 7, wherein the ferrimagnet racetrack layer includes a multilayer ferrimagnet structure having one or more layers of material pairs selected from the group consisting of Co/Tb, Co/Gd, Fe/Tb and Fe/Gd.

11. The device as recited in claim 7, further comprising a weight that is inversely proportional to a tunneling magnetoresistance of the device.

12. The device as recited in claim 7, wherein the first, second and third contacts are configured to control domain wall motion and magnetization direction of the racetrack layer to provide a plurality of states for the device.

* * * * *